(12) United States Patent
Pavatich et al.

(10) Patent No.: US 6,429,782 B2
(45) Date of Patent: *Aug. 6, 2002

(54) DETECTION SYSTEM AND SWITCH DEVICE

(75) Inventors: Gianfranco Pavatich, Keiler Downs; Daniel Phillip Gangemi, Research, both of (AU)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,076

(22) Filed: Apr. 5, 1999

(30) Foreign Application Priority Data

Apr. 3, 1998 (AU) .................................. PP2777

(51) Int. Cl.[7] ................................. G08B 21/00
(52) U.S. Cl. .................... 340/686.6; 340/825.31; 361/181
(58) Field of Search .............. 340/686.6, 825.31, 340/562, 407.1, 658; 361/181; 307/10.3, 10.2

(56) References Cited

U.S. PATENT DOCUMENTS

| 3,891,980 | A | | 6/1975 | Lewis et al. ........ 340/10.5 |
|---|---|---|---|---|
| 4,760,490 | A | * | 7/1988 | Murao ............... 361/181 |
| 4,868,915 | A | | 9/1989 | Anderson, III et al. . 340/825.31 |
| 4,871,204 | A | | 10/1989 | Cook et al. .......... 292/251.5 |
| 5,467,022 | A | | 11/1995 | Aoki et al. ........... 324/661 |
| 5,621,290 | A | | 4/1997 | Heller et al. ......... 318/466 |
| 5,880,538 | A | * | 3/1999 | Schulz ............... 307/109 |

FOREIGN PATENT DOCUMENTS

| DE | 196 20 059 A1 | 11/1997 |
|---|---|---|
| EP | 0 805 247 A1 | 11/1997 |
| WO | 97/01835 | 1/1997 |

* cited by examiner

*Primary Examiner*—Daniel J. Wu
*Assistant Examiner*—Sihong Huang
(74) *Attorney, Agent, or Firm*—Kenyon & Kenyon

(57) ABSTRACT

A detection system includes a switch device having a conductor forming part of a capacitor with variable capacitance dependent upon proximity of a person, and a detector for sensing variation in the capacitance and for generating an output signal indicating the proximity of the person relative to the conductor. The switch device further includes a retaining body adapted to mount the conductor to a door handle, the retaining body also having a mechanical switch arranged for actuation by a person gripping the handle to additionally or alternatively indicate the proximity of the person.

4 Claims, 2 Drawing Sheets

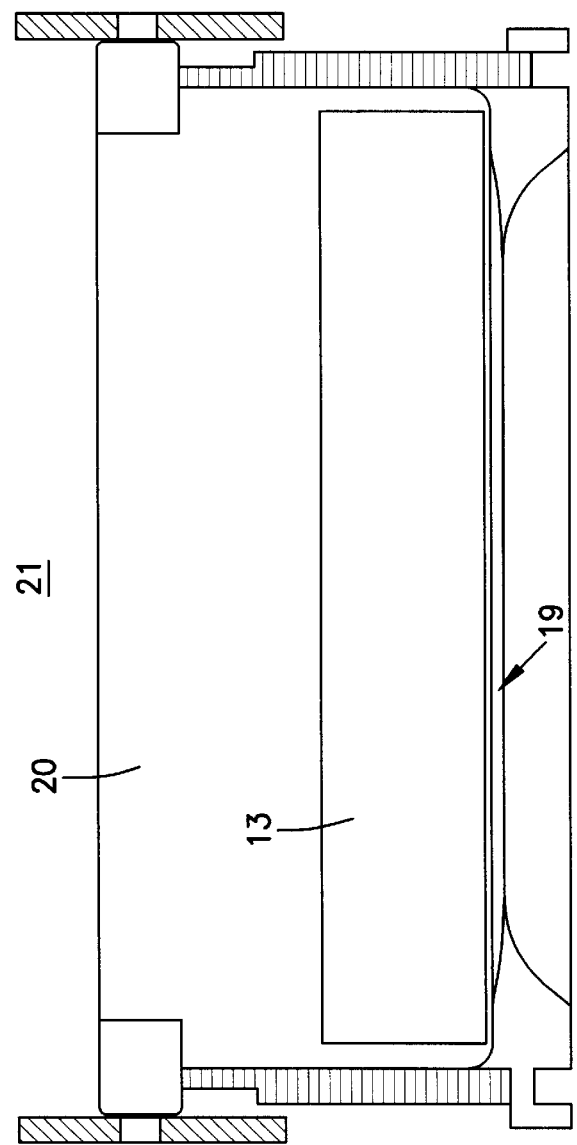
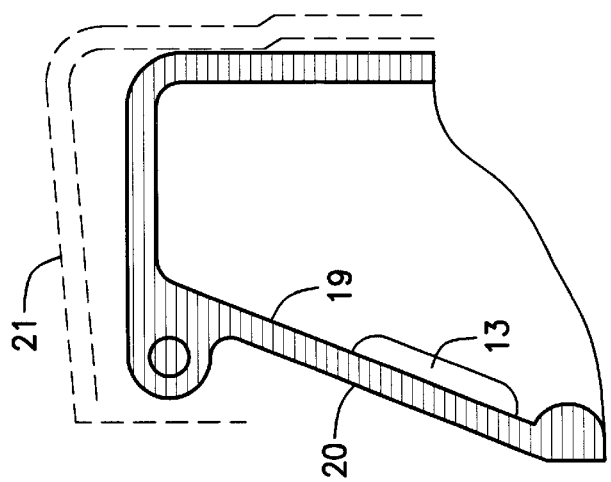
Fig. 3
Fig. 2

DETECTION SYSTEM AND SWITCH DEVICE

FIELD OF THE INVENTION

The present invention relates to a detection system particularly, but not exclusively, detecting proximity of a person relative to a vehicle for initiating communication between a security system of the vehicle and a transponder carried by the person.

BACKGROUND OF THE INVENTION

A security system for a vehicle has been developed which, instead of requiring remote activation by a transceiver or transponder, can be activated by movement of a door handle of the vehicle. An activation or unlock signal is generated by the security system to disengage a mechanical latch mechanism of the door when the person grips and moves the door handle. A system of this type can also be used for entry to other restricted areas, such as domestic or commercial dwellings.

A disadvantage of the above security system is that an authorized person wishing to gain entry through the door may grip and move the door handle faster than the security system is able to unlock the door. Not only does this give rise to frustration to users of the system, but it can also result in persons sustaining physical injury if the door is not unlocked in time.

An alternative security system is described in German Patent Application No. DE 19620059, wherein a capacitive proximity switch is provided in a door handle. The switch includes a plurality of electrodes arranged for capacitive coupling therebetween, such that proximity of a person's hand is detected without the need for separate movement of the door handle.

It is an object of the present invention to provide an improved detection system utilizing a capacitive proximity switch.

SUMMARY OF THE INVENTION

In accordance with the present invention, there is provided a detection system including a switch device having a conductor forming part of a capacitor having variable capacitance dependent upon proximity of a person, and a detector for sensing variation in the capacitance and for generating an output signal indicating the proximity of the person relative to the conductor, wherein the switch device further includes a retaining body adapted to mount the conductor to a door handle, the retaining body also having a switch arranged for actuation by a person gripping the handle to additionally or alternatively indicate the proximity of the person.

In another aspect, there is provided a switch device for use in the above-described detection system, the device including a conductor for forming part of a capacitor for detecting proximity of a person, a switch and a retaining body housing the conductor and switch and arranged to mount the device to a door handle.

Preferably, the body is a membrane with the conductor and switch embedded therein in juxtaposed relation.

Preferably, the switch is a mechanical switch formed of two or more conductive plates separated by electrically insulative material and adapted for relative displacement into electrical contact for actuation of the switch. More preferably, the conductor forms one of the plates of the mechanical switch. Alternatively, the switch includes a piezoelectric strip which produces a detection signal when the person grips the handle and imparts relative movement of a part of the strip.

Preferably, the detector includes an oscillator coupled to the conductor and a phase comparator, such that the variation in the capacitance results in an associated change in frequency of oscillation in the oscillator, to produce a phase modulated signal therein which is input to the phase comparator so as to generate a signal representative of this change in frequency.

Preferably, the phase comparator forms part of a phase-locked loop circuit and the detector further includes a comparator arranged whereby the feedback/error signal of the circuit is input to the comparator for comparison with a threshold level so as to generate the output signal indicating proximity of the person.

Alternatively, the phase-locked loop circuit and comparator may be replaced with a microcontroller which monitors the oscillator to determine quiescent frequency characteristic and generates an output signal indicative of the proximity of the person upon detecting variation, above a threshold level, of the frequency characteristics. The microcontroller may be programmed to adjust the threshold level in accordance with changes to the frequency characteristics introduced as a result of temperature variation.

In another aspect, there is provided a security system including a control unit, the above-described detection system and a lock, the control unit actuating an interrogation procedure, upon detection of proximity of the person, for checking security associated with the person and releasing the lock if the security requirements are met.

Preferably, the security system is a vehicle locking or disabling system which is actuated by the control unit for interrogation of a corresponding transponder carried by the person.

BRIEF DESCRIPTION OF THE DRAWINGS

FIG. 2 is a cross-sectional view of a door handle which may be used in the present invention.

FIG. 3 is a front view of the handle of FIG. 2.

DETAILED DESCRIPTION

Figure 1:
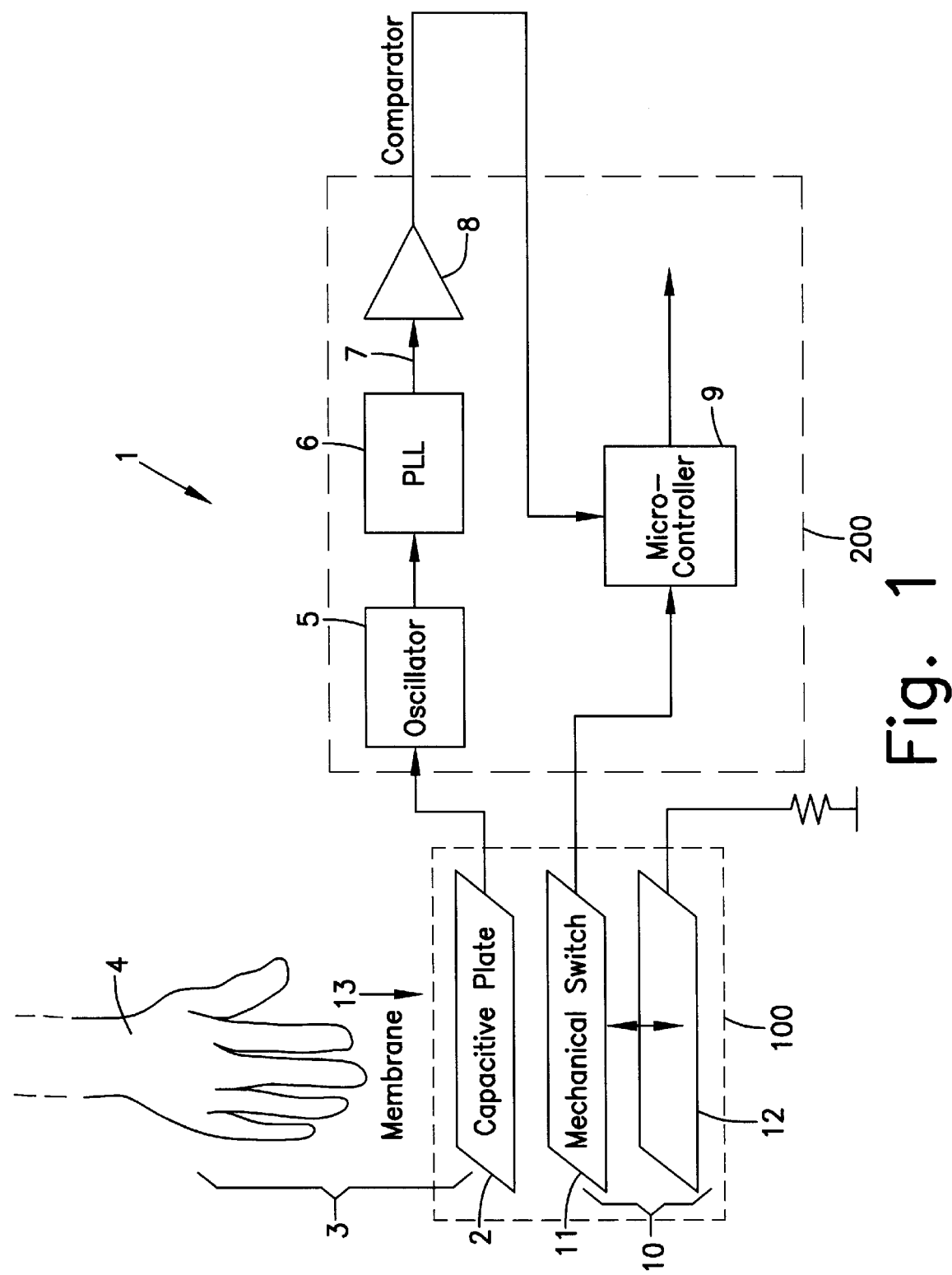
FIG. 1 is a diagrammatic representation of a detection system in accordance with the present invention.

The detection system 1 of FIG. 1 includes a switch device 100 which houses a conductor in the form of a capacitive plate 2 adapted to form a capacitor 3 coupling with a user's hand. The plate 2 is connected to a detector 200 which includes an oscillator circuit 5 which in turn is connected to a phase comparator (not shown) of a phase-locked loop circuit 6. The output 7 from the phase-locked loop circuit 6 is input to a comparator 8 for comparison with a threshold value for output to a microcontroller 9.

The microcontroller 9 is also connected to a mechanical switch 10, which forms part of the switch device 100 and comprises a plurality of conductive plates 11, 12, one of which is grounded. The switch preferably includes two plates, as shown, but may also include three, four, or more. The plates are spaced apart by insulative material (not shown) and adapted for relative displacement into electrical contact for actuation of the switch. The mechanical switch 10 and capacitive plate 2 are arranged in juxtaposed relation and encased in a common retaining body which is preferably in the form of a waterproof membrane 13. The capacitive plate 2 is illustrated as being separate from the mechanical switch but may instead form one of the conductive plates of the switch.

The detector functions by sensing variation in the capacitance of the capacitor 3 as the hand 4 approaches the capacitive plate 2. The variation in capacitance effects a change in the frequency of the oscillator 5, which would otherwise oscillate at a constant frequency. For example, as the hand 4 approaches the plate 2 the capacitance increases which results in a decrease in the oscillator frequency. The change of frequency provides a phase change in the output signal of the oscillator 5 which is passed through the phase comparator of the phase-locked loop circuit 6 to generate an error signal or feedback signal of the phase-locked loop circuit which is input to the comparator 8 for comparison with a predetermined threshold. Accordingly, as the hand 4 is moved toward the capacitor 2, an error signal is generated from the phase-locked loop circuit and, if this signal exceeds the threshold, the comparator will produce an appropriate logic high output which is fed to the microcontroller 9 for activating, for example, an interrogation procedure of a security system.

In the event the capacitive change is not recorded, the mechanical switch may be manually depressed to provide a signal to the microcontroller to enable the interrogation procedure.

As an alternative to the phase-locked loop circuit and comparator arrangement, the microcontroller may instead be arranged to track the oscillator over time to determine quiescent frequency characteristics and a suitable algorithm may be implemented to adapt to the frequency characteristics and rate-of-change of frequency. Such an arrangement would be more dynamic in that the microcontroller may be able to monitor and track changes in the frequency characteristics resulting from temperature variation and adjust the threshold level accordingly.

The membrane 13, encasing the capacitive plate 2 and mechanical switch 10, may be attached to an underside 19 of a door handle 20 of a vehicle 21 in the manner shown in FIGS. 2 and 3. The capacitive plate is thereby positioned in a suitable location for capacitor coupling with the hand 4 of the user and the mechanical switch is positioned where the user's fingers would be positioned to lever the door handle to an open condition. In this arrangement, the detection system may be included in a security system of the car such that detection of the proximity of the person or actuation of the mechanical switch will result in the microcontroller activating an interrogation procedure such as by energizing a transponder in the car which checks security codes of an associated transponder carried by the person. If the security requirements are met, the system would then be effective in unlocking the door handle 20 prior to lever action being applied to the handle itself.

As can be appreciated, the early activation of the security system overcomes the problem of delay times associated with a simple mechanical activation of the security system. The present invention thereby utilizes the advantage of capacitive proximity sensing while having the mechanical switch for back-up or redundancy in the event the capacitive detection fails to sense variation in the capacitance or in any event a person contacts the switch. The juxtaposed arrangement of the capacitive plate and the mechanical switch also minimizes the profile of the device 100 to thereby allow it to be conventionally attached to an underside of a door handle or the like, while the arrangement where the capacitive plate forms part of the mechanical switch itself allows for reduction of the number of component parts of the device.

It should also be appreciated that the detection system may be utilized in any other application where proximity of a person may be used to activate security systems. Further, an additional capacitive plate (not shown) may also be employed so as to form a conventional capacitive proximity switch together with the plate 2.

As a further alternative, the mechanical switch may be replaced with a piezoelectric strip which produces a detection signal when the person grips the handle and imparts relative movement of a part of the strip.

What is claimed is:

1. A detection system comprising:

a switch device including a conductor forming part of a capacitor having a variable capacitance dependent upon a proximity of a person; and a detector for sensing a variation in the capacitance and for generating an output signal indicating the proximity of the person relative to the conductor, wherein the switch device further includes a retaining body adapted to mount the conductor to a door handle, the retaining body having a switch arranged for an actuation by a person gripping the door handle to indicate the proximity of the person, wherein the detector includes an oscillator coupled to the conductor and includes a phase comparator, the variation in the capacitance resulting in an associated change in a frequency of oscillation in the oscillator, to produce a phase modulated signal therein which is input to the phase comparator so as to generate a signal representative of the change in frequency.

2. The detection system according to claim 1, wherein the phase comparator forms a part of a phase-locked loop circuit and the detector further includes a comparator, a feedback/error signal of the circuit being input to the comparator for a comparison with a threshold level so as to generate the output signal indicating the proximity of the person.

3. A security system comprising:

a switch device including a conductor forming part of a capacitor having a variable capacitance dependent upon a proximity of a person;

a detector for sensing a variation in the capacitance and for generating an output signal indicating the proximity of the person relative to the conductor, wherein the switch device further includes a retaining body adapted to mount the conductor to a door handle, the retaining body having a switch arranged for an actuation by a person gripping the door handle to indicate the proximity of the person;

a lock; and a control unit actuating an interrogation procedure, upon detecting the proximity of the person, for checking a security associated with the person and releasing the lock if predetermined security requirements are met.

4. The security system according to claim 3, wherein the security system is a vehicle locking or disabling system which is actuated by the control unit for interrogating a corresponding transponder carried by the person.

* * * * *